United States Patent
Xie

(10) Patent No.: US 9,773,943 B1
(45) Date of Patent: Sep. 26, 2017

(54) QUANTUM DOT LIGHT-EMITTING DIODE AND MANUFACTURING METHOD THEREOF

(71) Applicant: Zaifeng Xie, Shenzhen (CN)

(72) Inventor: Zaifeng Xie, Shenzhen (CN)

(73) Assignee: AAC TECHNOLOGIES PTE. LTD., Singapore (SG)

( * ) Notice: Subject to any disclaimer, the term of this patent is extended or adjusted under 35 U.S.C. 154(b) by 0 days.

(21) Appl. No.: 15/416,357

(22) Filed: Jan. 26, 2017

(30) Foreign Application Priority Data

Dec. 8, 2016 (CN) .......................... 2016 1 1121676

(51) Int. Cl.
| H01L 33/06 | (2010.01) |
| H01L 33/48 | (2010.01) |
| H01L 33/08 | (2010.01) |
| H01L 33/44 | (2010.01) |

(52) U.S. Cl.
CPC .............. *H01L 33/06* (2013.01); *H01L 33/08* (2013.01); *H01L 33/44* (2013.01); *H01L 33/483* (2013.01)

(58) Field of Classification Search
CPC .............. H01L 27/3218; H01L 51/504; H01L 51/5092; H01L 27/3206; H01L 27/3209
See application file for complete search history.

(56) References Cited

U.S. PATENT DOCUMENTS

| 2006/0238113 A1* | 10/2006 | Kashiwabara | ......... C09K 11/06 313/504 |
| 2014/0048785 A1* | 2/2014 | Heuser | .................. H01L 51/002 257/40 |
| 2015/0102310 A1* | 4/2015 | Diez | .................... H01L 51/5278 257/40 |
| 2015/0287927 A1* | 10/2015 | Okubo | ................... B82Y 20/00 257/40 |
| 2016/0322583 A1* | 11/2016 | Kim | .................... H01L 51/0067 |

* cited by examiner

*Primary Examiner* — Dung Le
(74) *Attorney, Agent, or Firm* — Na Xu; IPro, PLLC

(57) ABSTRACT

The present disclosure provides a quantum dot light-emitting diode and a manufacturing method thereof. The quantum dot light-emitting diode, comprising a base plate, a hole transport layer, a quantum dot light-emitting layer, an electron transport layer and a cathode stacked on the base plate in sequence. The quantum dot light-emitting diode further comprises a hole planarized layer formed between the hole transport layer and the quantum dot light-emitting layer, the quantum dot light-emitting layer comprises a first quantum dot sublayer, a second quantum dot sublayer and a third quantum dot sublayer stacked in sequence, the first quantum dot sublayer and the third quantum dot sublayer are negatively charged, and the second quantum dot sublayer is positively charged.

15 Claims, 2 Drawing Sheets

QUANTUM DOT LIGHT-EMITTING DIODE AND MANUFACTURING METHOD THEREOF

FIELD OF THE DISCLOSURE

The present disclosure relates to the technical field of light-emitting diodes and, specifically, to a quantum dot light-emitting diode and a manufacturing method thereof.

BACKGROUND

Light-emitting diodes have been increasingly applied in modern display technology, and are advantageous over traditional light sources, such as low energy consumption, long service life, firmness, small size and quick conversion. Inorganic quantum dot light-emitting diodes are superior to organic light-emitting diodes and other light-emitting diodes, including stability, solution processability and outstanding color purity. Therefore, the quantum dot light-emitting diodes have been increasingly widely developed for use in the fields of display and light sources.

In relevant technologies, quantum dot light-emitting diodes adopt CdSe—ZnS quantum dots as a light-emitting material layer, and this is obtained by spin-coating, printing, casting or other such methods in which the phenomena of material surface deficiency and focusing tend to occur, leading to the defects of low density and relatively low uniformity of quantum dots and thereby influencing the light-emitting performance of the quantum dot light-emitting diodes.

Therefore, it is desired to provide a quantum dot light-emitting diode and a manufacturing method thereof to overcome the aforesaid problems.

BRIEF DESCRIPTION OF THE DRAWINGS

Many aspects of the embodiments can be better understood with reference to the following drawings. The components in the drawing are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Reference will now be made to describe an exemplary embodiment of the present invention in detail.

Figure 1:
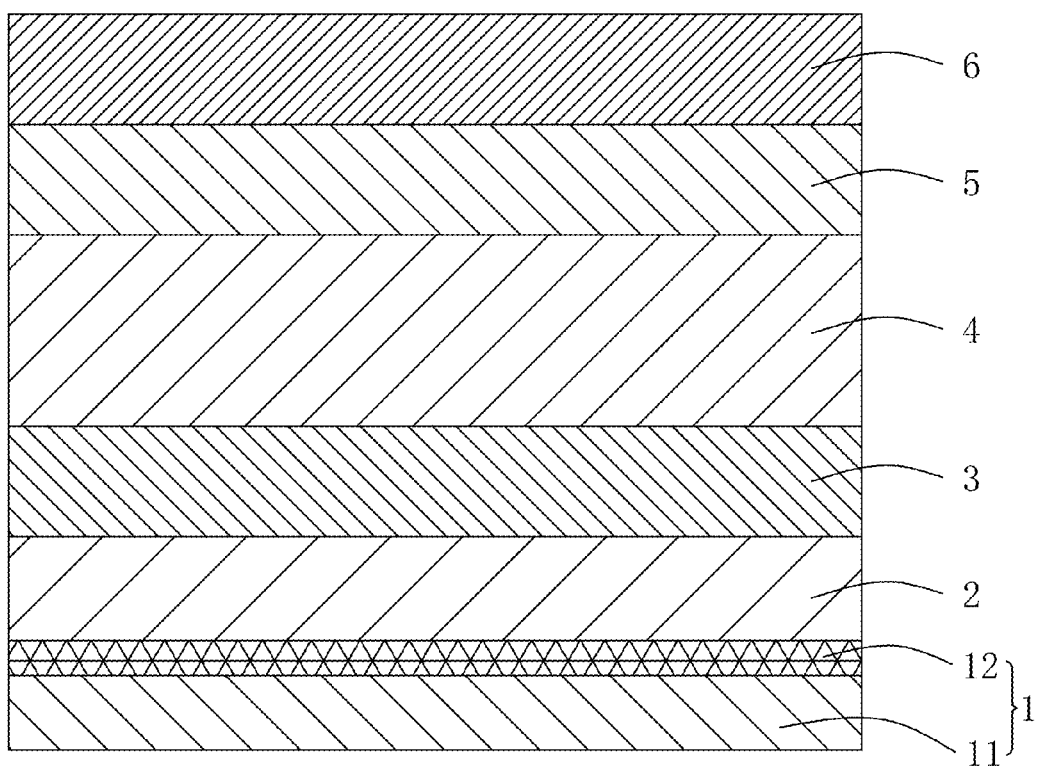
FIG. 1 is a structural schematic diagram of a quantum dot light-emitting diode provided by the present disclosure.

As shown in FIG. 1, a quantum dot light-emitting diode 100 includes a base plate 1, a hole transport layer 2, a hole planarized layer 3, a quantum dot light-emitting layer 4, an electron transport layer 5 and a cathode 6 stacked in sequence.

The base plate 1 includes a substrate 11 and a conductive anode 12 deposited on the substrate 11. The substrate 11 is a rigid substrate or a flexible substrate, wherein the rigid substrate is made of glass, silicon wafer or other rigid material; and the flexible substrate is made of plastic, aluminum foil, ultrathin metal or ultrathin glass. The conductive anode 12 is made of ITO (Indium Tin Oxides), graphene, indium gallium zinc oxide or other conductive material, and is deposited on the surface of the substrate 11 by sputtering, evaporation and the like.

The hole transport layer 2 is made of metal oxide nano particles, which are selected from metal oxides of Group VIII or IIIA elements, e.g., NiO, B2O3, In2O3, etc., preferably NiO. The hole transport layer 2 is deposited on the base plate 1 by a sol-gel process, and has a thickness of 10-50 nm.

The hole planarized layer 3 is a polymer film having a thickness of 1-100 nm, and the polymer film is preferably made of poly(N,N'-diphenyl-N,N'-di(3-methylphenyl-1,1-biphenyl-4,4'-diamine)), and is deposited on the hole transport layer 2 by a spin-coating process.

Figure 2:
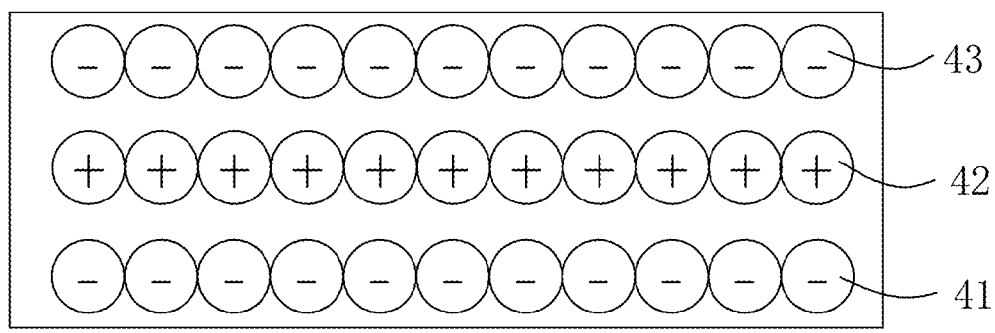
FIG. 2 is a structural schematic diagram of a quantum dot light-emitting layer in the quantum dot light-emitting diode shown in FIG. 1.

Reference is made to FIG. 2, which is a structural schematic diagram of a quantum dot light-emitting layer in the quantum dot light-emitting diode shown in FIG. 1. The quantum dot light-emitting layer 4 is of an RGB light-emitting layer structure, and includes a first quantum dot sublayer 41, a second quantum dot sublayer 42 and a third quantum dot sublayer 43. The first quantum dot sublayer 41 is a negatively charged blue light-emitting layer, the second quantum dot sublayer 42 is a positively charged green light-emitting layer, and the third quantum dot sublayer 43 is a negatively charged red light-emitting layer. The first quantum dot sublayer 41, the second quantum dot sublayer 42 and the third quantum dot sublayer 43 are automatically assembled by electrostatic adsorption of surface charges, and the thickness of each sublayer ranges from 1 nm to 10 nm.

Each of the first quantum dot sublayer 41, the second quantum dot sublayer 42 and the third quantum dot sublayer 43 includes a plurality of nano-particles and organic ligands formed on the surfaces of the nano-particles. The nano-particles are single material rods, or are of a multilayer structure formed by a core and a shell, or are of a multilayer structure formed by a core, a passivation layer and a shell, and the single material rods, the cores, the passivation layers and the shells can be made of the same material or different materials, which can be metal, metal alloy, metal oxides, insulators or semiconductor materials. Preferably, the material of the nano-particles is selected from Group IIIB, IVB, VB, VIB, VIIB, VIII, IB, IIB, IIIA, IVA or VA elements, and more preferably, the material of the nano-particles is selected from at least one of Sc, Ti, V, Cr, Mn, Fe, Ni, Cu, Zn, Y, Zr, Nb, Tc, Ru, Mo, Rh, W, Au, Pt, Pd, Ag, Co, Cd, Hf, Ta, Re, Os, Ir and Hg. The organic ligands have functional groups COO— or/and NH4+.

In this embodiment, the first quantum dot sublayer 41 is CdSe-poly(methacrylic-co-octadecyl methacrylate)-(ethanolamine-ethylenediamine folate); the second quantum dot sublayer 42 is CdSe-poly(dimethylamino)ethyl methacrylate; the third quantum dot sublayer 43 is CdSe-poly(methacrylic-co-octadecyl methacrylate)-(ethanolamine-ethylenediamine folate), and each sublayer is deposited by spin-coating.

The electron transport layer 5 is made of metal oxide nano particles, which are selected from metal oxides of Group IIB or VA elements, e.g., ZnO or Sb2O3, etc., preferably ZnO. The electron transport layer 5 is deposited on the quantum dot light-emitting layer 4 by a sol-gel process, and has a thickness of 10-30 nm.

The cathode 6 is made of Al and deposited on the electron transport layer 5 by vacuum thermal evaporation, and the cathode 6 is electrically connected with the conductive anode 12.

The present disclosure provides a manufacturing method of a quantum dot light-emitting diode, including the following steps:

step S1: forming a hole transport layer 2 on a base plate 1;

specifically, step S1 includes pretreatment of the base plate: firstly, ultrasonically cleaning the base plate 1 with acetone or an isopropyl amine solution; then heating the base plate 1 at a temperature of 120-200° C. and baking the base plate 1 for 20-50 min; transferring the base plate 1 to a plasma cleaner, and introducing Ar/O2 gas under the radio-frequency action of 13.56 MHZ to remove organic matters from the base plate for 10-20 min; and depositing the hole transport layer 2 on the pretreated base plate 1 by a sol-gel process, wherein the hole transport layer 2 is made of NiO nano particles, and has a thickness of 10-50 nm;

step S2: forming a hole planarized layer 3 on the hole transport layer 2;

specifically, coating the hole transport layer 2 with a layer of poly(N,N'-diphenyl-N,N'-di(3-methylphenyl-1,1-biphenyl-4,4'-diamine)) by a spin-coating device to form the hole planarized layer 3 having a thickness of 1-100 nm;

step S3: forming a quantum dot light-emitting layer 4 on the hole planarized layer 3 in a self-assembly mode of electrostatic adsorption of surface charges;

specifically, on the hole planarized layer 3, spin-coating a negatively charged blue light-emitting layer CdSe-poly (methacrylic-co-octadecyl methacrylate)-(ethanolamine-ethylenediamine folate) to form a first quantum dot sublayer 41 having a thickness of 1-10 nm; then spin-coating a positively charged green light-emitting layer CdSe-poly (dimethylamino)ethyl methacrylate to form a second quantum dot sublayer 42 having a thickness of 1-10 nm; finally depositing a negatively charged red light-emitting layer CdSe-poly(methacrylic-co-octadecyl methacrylate)-(ethanolamine-ethylenediamine folate) to form a third quantum dot sublayer 43 having a thickness of 1-10 nm; and assembling the first quantum dot sublayer 41, the second quantum dot sublayer 42 and the third quantum dot sublayer 43 by electrostatic adsorption of surface charges; and step S4: forming an electron transport layer 5 and a cathode 6 on the quantum dot light-emitting layer 4 in sequence;

specifically, depositing the electron transport layer 5 having a thickness of 10-30 nm on the quantum dot light-emitting layer 4 by a sol-gel process, the electron transport layer 5 being made of ZnO nano particles; then depositing the cathode 6 on the electron transport layer 5 by vacuum thermal evaporation, the cathode 6 being made of Al; and electrically connecting the cathode with a conductive anode 12.

Compared with the prior art, the quantum dot light-emitting diode provided by the present disclosure has the advantages that a hole planarized layer, which is disposed between the hole transport layer and the quantum dot light-emitting layer, achieves a planarization effect on the growth of quantum dots, reduces the energy barrier between holes and the light-emitting layer and improves the hole transport efficiency; the quantum dot light-emitting layer is formed in a self-assembly mode of electrostatic adsorption of surface charges, thereby effectively avoiding stacking or deficiency of quantum dots, effectively improving the surface density and uniformity of quantum dots and improving the luminous efficiency of the quantum dot light-emitting diode; the quantum dot light-emitting layer is of an RGB light-emitting layer structure in which the first quantum dot sublayer is a negatively charged blue light-emitting layer, the second quantum dot sublayer is a positively charged green light-emitting layer and the third quantum dot sublayer is a negatively charged red light-emitting layer, so that the quantum dot light-emitting diode is a full-color light-emitting diode.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A quantum dot light-emitting diode, comprising:
a base plate,
a hole transport layer, a quantum dot light-emitting layer, an electron transport layer and a cathode stacked on the base plate in sequence,
wherein the quantum dot light-emitting diode further comprises:
a hole planarized layer formed between the hole transport layer and the quantum dot light-emitting layer, the quantum dot light-emitting layer comprises a first quantum dot sublayer, a second quantum dot sublayer and a third quantum dot sublayer stacked in sequence, the first quantum dot sublayer and the third quantum dot sublayer are negatively charged, and the second quantum dot sublayer is positively charged, wherein the quantum dot light-emitting layer is of an RGB light-emitting layer structure, the first quantum dot sublayer is a negatively charged blue light-emitting layer, the second quantum dot sublayer is a positively charged green light-emitting layer, and the third quantum dot sublayer is a negatively charged red light-emitting layer.

2. The quantum dot light-emitting diode as described in claim 1, wherein each of the first quantum dot sublayer, the second quantum dot sublayer and the third quantum dot sublayer comprises a plurality of nano-particles and organic ligands formed on the surfaces of the nano-particles.

3. The quantum dot light-emitting diode as described in claim 2, wherein the nano-particles are single material rods.

4. The quantum dot light-emitting diode as described in claim 3, wherein the single material rods are made of metal, metal alloy, metal oxides, insulators or semiconductor materials.

5. The quantum dot light-emitting diode as described in claim 2, wherein the nano-particles are of a multilayer structure formed by a core and a shell.

6. The quantum dot light-emitting diode as described in claim 5, wherein the core and the shell are made of metal, metal alloy, metal oxides, insulators or semiconductor materials.

7. The quantum dot light-emitting diode as described in claim 2, wherein the nano-particles are of a multilayer structure formed by a core, a passivation layer and a shell.

8. The quantum dot light-emitting diode as described in claim 6, wherein the core, the passivation layer and the shell are made of metal, metal alloy, metal oxides, insulators or semiconductor materials.

9. The quantum dot light-emitting diode as described in claim 2, wherein the material of the nano-particles is selected from Group IIIB, IVB, VB, VIB, VIIB, VIII, IB, IIB, IIIA, IVA or VA elements.

10. The quantum dot light-emitting diode as described in claim 9, wherein the material of the nano-particles is at least one of Sc, Ti, V, Cr, Mn, Fe, Ni, Cu, Zn, Y, Zr, Nb, Tc, Ru, Mo, Rh, W, Au, Pt, Pd, Ag, Co, Cd, Hf, Ta, Re, Os, Ir and Hg.

11. The quantum dot light-emitting diode as described in claim 2, wherein the organic ligands have functional groups COO— or/and NH4+.

12. The quantum dot light-emitting diode as described in claim 11, wherein the organic ligand of the first quantum dot sublayer is poly(methacrylic-co-octadecyl methacrylate)-(ethanolamine-ethylenediamine folate); the organic ligand of the second quantum dot sublayer is (dimethylamino)ethyl methacrylate; and the organic ligand of the third quantum dot sublayer is poly(methacrylic-co-octadecyl methacrylate)-(ethanolamine-ethylenediamine folate).

13. The quantum dot light-emitting diode as described in claim 1, wherein the thicknesses of the first quantum dot sublayer, the second quantum dot sublayer and the third quantum dot sublayer range from 1 nm to 10 nm.

14. The quantum dot light-emitting diode as described in claim 1, wherein the hole planarized layer is a polymer film having a thickness of 1-100 nm, and the polymer film is made of poly(N,N'-diphenyl-N,N'-di(3-methylphenyl-1,1-biphenyl-4,4'-diamine)).

15. A manufacturing method of a quantum dot light-emitting diode, comprising the following steps:
    providing a base plate, and forming a hole transport layer on the base plate;
    forming a hole planarized layer on the hole transport layer;
    coating the hole planarized layer with a negatively charged first quantum dot sublayer, a positively charged second quantum dot sublayer and a negatively charged third quantum dot sublayer in sequence, and forming a quantum dot light-emitting layer by the first quantum dot sublayer, the second quantum dot sublayer and the third quantum dot sublayer in a self-assembly mode of electrostatic adsorption of surface charges; and
    forming an electron transport layer and a cathode on the quantum dot light-emitting layer in sequence, wherein the quantum dot light-emitting layer is of an RGB light-emitting layer structure, the first quantum dot sublayer is a negatively charged blue light-emitting layer, the second quantum dot sublayer is a positively charged green light-emitting layer, and the third quantum dot sublayer is a negatively charged red light-emitting layer.

\* \* \* \* \*